United States Patent
Baukus et al.

[19]

[11] Patent Number: 5,973,375
[45] Date of Patent: Oct. 26, 1999

[54] CAMOUFLAGED CIRCUIT STRUCTURE WITH STEP IMPLANTS

[75] Inventors: James P. Baukus, Westlake Village; Lap-Wai Chow, South Pasadena; William M. Clark, Jr., Thousand Oaks, all of Calif.

[73] Assignee: Hughes Electronics Corporation, El Segundo, Calif.

[21] Appl. No.: 08/869,524

[22] Filed: Jun. 6, 1997

[51] Int. Cl.[6] ................................................. H01L 29/78
[52] U.S. Cl. ........................ 257/399; 257/648; 438/298
[58] Field of Search .................................. 257/398, 399, 257/900, 647, 648, 390, 376; 438/297, 298

[56] References Cited

U.S. PATENT DOCUMENTS

| | | |
|---|---|---|
| 3,946,426 | 3/1976 | Sanders . |
| 4,139,864 | 2/1979 | Schulman . |
| 4,164,461 | 8/1979 | Schilling . |
| 4,267,578 | 5/1981 | Vetter . |
| 4,291,391 | 9/1981 | Chatterjee et al. . |
| 4,295,897 | 10/1981 | Tubbs et al. . |
| 4,314,268 | 2/1982 | Yoshioka et al. . |
| 4,317,273 | 3/1982 | Guterman et al. ........................ 29/571 |
| 4,374,454 | 2/1983 | Jochems ................................... 29/571 |
| 4,435,895 | 3/1984 | Parrillo et al. ........................... 257/376 |

(List continued on next page.)

FOREIGN PATENT DOCUMENTS

| | | |
|---|---|---|
| 2486717 | 1/1982 | France . |
| 58-190064 | 4/1982 | Japan . |
| 63-129647 | 6/1988 | Japan . |
| 2-46762 | 2/1990 | Japan . |
| 2-237038 | 9/1990 | Japan . |
| 4028092 | 1/1992 | Japan . |

OTHER PUBLICATIONS

Lee, "Engineering a Device for Electron–beam Probing", *IEEE Design & Test of Computers*, 1989, pp. 36–49.

U.S. application No. 07/278,889, Crafts, filed Dec. 2, 1988.

Frederiksen, Thomas M. "Intuitive CMOS Electronics" McGraw–Hill Publishing Co., 1989, pp. 134–145.

*Primary Examiner*—David B. Hardy
*Attorney, Agent, or Firm*—V. D. Duraiswamy; M. W. Sales

[57] ABSTRACT

Connections between implanted regions in a semiconductor substrate, such as the sources or drains of adjacent transistors, are made by buried conductive implants rather than upper level metalizations. The presence or absence of a connection between two implanted regions is camouflaged by implanting a conductive buried layer of the same doping conductivity as the implanted regions when a connection is desired, and a field implant of opposite conductivity to the implanted regions when no connection is desired, and forming steps into the substrate at the boundaries of the buried layer or field implant that mask the steps formed between different conductivity regions during a selective etch by a reverse engineer. The masking steps are preferably formed by field oxide layers that terminate at the boundaries of the buried layers and field implants.

32 Claims, 6 Drawing Sheets

U.S. PATENT DOCUMENTS

| | | |
|---|---|---|
| 4,471,376 | 9/1984 | Morcom et al. . |
| 4,581,628 | 4/1986 | Miyauchi et al. . |
| 4,583,011 | 4/1986 | Pechar . |
| 4,603,381 | 7/1986 | Guttag . |
| 4,623,255 | 11/1986 | Suszko . |
| 4,727,493 | 2/1988 | Taylor, Sr. . |
| 4,766,516 | 8/1988 | Ozdemir et al. . |
| 4,799,096 | 1/1989 | Koeppe ................................... 357/42 |
| 4,821,085 | 4/1989 | Haken et al. . |
| 4,830,974 | 5/1989 | Chang et al. ........................... 257/376 |
| 4,975,756 | 12/1990 | Haken et al. . |
| 5,030,796 | 7/1991 | Swanson et al. . |
| 5,050,123 | 9/1991 | Castro . |
| 5,061,978 | 10/1991 | Mizutani et al. . |
| 5,065,208 | 11/1991 | Shah et al. . |
| 5,068,697 | 11/1991 | Noda et al. . |
| 5,070,378 | 12/1991 | Yamagata . |
| 5,101,121 | 3/1992 | Sourgen . |
| 5,117,276 | 5/1992 | Thomas et al. . |
| 5,132,571 | 7/1992 | McCollum et al. . |
| 5,138,197 | 8/1992 | Kuwana ................................. 307/449 |
| 5,146,117 | 9/1992 | Larson . |
| 5,168,340 | 12/1992 | Nishimura .............................. 257/376 |
| 5,202,591 | 4/1993 | Walden . |
| 5,227,649 | 7/1993 | Chapman . |
| 5,231,299 | 7/1993 | Ning et al. . |
| 5,302,539 | 4/1994 | Haken et al. . |
| 5,308,682 | 5/1994 | Morikawa . |
| 5,309,015 | 5/1994 | Kuwata et al. . |
| 5,336,624 | 8/1994 | Walden . |
| 5,354,704 | 10/1994 | Yang et al. . |
| 5,369,299 | 11/1994 | Byrne . |
| 5,371,390 | 12/1994 | Mohsen . |
| 5,376,577 | 12/1994 | Roberts et al. . |
| 5,384,472 | 1/1995 | Yin . |
| 5,399,441 | 3/1995 | Bearinger et al. . |
| 5,441,902 | 8/1995 | Hsieh et al. . |
| 5,468,990 | 11/1995 | Daum . |
| 5,475,251 | 12/1995 | Kuo et al. . |
| 5,539,224 | 7/1996 | Ema . |
| 5,721,150 | 2/1998 | Pasch . |
| 5,783,846 | 7/1998 | Baukus et al. ......................... 257/204 |

CAMOUFLAGED CIRCUIT STRUCTURE WITH STEP IMPLANTS

RELATED APPLICATION

This application is related to application Ser. No. 08/532,326, filed Sep. 22, 1995.

BACKGROUND OF THE INVENTION

1. Field of the Invention

This invention relates to the prevention of reverse engineering of integrated circuits (ICs), and more particularly to security techniques in which the conductive or nonconductive nature of interconnections between circuit elements is made camouflaged.

2. Description of the Related Art

Several techniques have been used to reverse engineer Ics. Electron (e)-beam probing with a scanning electron microscope (SEM), either through SEM photographs or voltage contrast analysis, is a standard reverse engineering mechanism, although secondary ion mass spectrometry (SIMS), spreading resistance analysis and various other techniques have also been used. A general description of e-beam probing is provided in Lee, "Engineering a Device for Electron-beam Probing", *IEEE Design & Test of Computers*, 1989, pages 36–49.

Numerous ways to frustrate unwanted attempts to reverse engineer an IC have also been developed. For example, in U.S. Pat. No. 4,766,516 to Ozdemir et al. (assigned to Hughes Electronics, the assignee of the present invention), additional circuit elements that do not contribute toward the desired circuit function are added to an IC, and disguised with the visible appearance of being an ordinary part of the IC. The elements have physical modifications that are not readily visible but cause them to function in a different manner, inhibiting the proper functioning of the IC in case of an attempted copying or other unauthorized use. When the apparent function rather than the actual function of the disguised elements is copied, the resulting circuit will not operate properly.

In U.S. Pat. No. 4,583,011 to Pechar a pseudo-MOS (metal oxide semiconductor) device is given a depletion implant that is not readily visible to a copier, who would infer from the device's location in the circuit that it would be enhancement-mode. A somewhat related approach is taken in French patent publication no. 2 486 717 by Bassett et al., published Jan. 15, 1982; the circuit doping is controlled so that some devices which appear to be transistors actually function as either open or short circuits. And in U.S. Pat. No. 4,603,381 to Guttag the memory of a central processing unit is programmed by the doping of its channel regions, rather than by the presence or absence of gates, to protect permanently programmed software.

Instead of disguising circuit elements, some systems have a mechanism to protect the circuit from operating until a correct access code has been entered. Such systems are described in U.S. Pat. Nos. 4,139,864 to Schulman and 4,267,578 to Vetter.

Each of the above protection schemes requires additional processing and/or uses additional circuitry that is dedicated to security and does not contribute to the basic functioning of the circuit. This increases the cost of circuit production and complicates the circuitry.

U.S. Pat. No. 4,799,096 to Koeppe uses doped implants to connect the sources and drains of different transistors to improve circuit reliability and testability, but the circuit function can be determined from the transistor arrangement. U.S. Pat. No. 5,138,197 to Kuwana connects different transistors in an address decoder array with doped implants, but circuit functions can be determined from clearly visible elements such as gate electrodes and circuit interconnects. Japanese patent publication 58-190064 to Sawase provides a metalization over a diffused source to block light from the source/substrate junction and thus reduce leakage current. While this tends to camouflage the source, the nature of the circuit can still be determined from its visible elements.

In related application Ser. No. 08/532,326, filed Sep. 22, 1995 by the present inventors, heavily doped implant interconnections that are difficult for a reverse engineer to detect are used to provide interconnections among the transistors of various types of logic cells, with the pattern of interconnections determining each cell's logic function. The transistors of the different cells are arranged in a common pattern and a uniform pattern of interconnections among transistors is provided for each cell; different logic functions are implemented by interrupting some of the interconnections with the addition of opposite conductivity channel stop implants. The channel stops are quite small, making the interrupted and thereby non-conductive interconnections appear the same to a reverse engineer as the conductive interconnections. CMOS digital circuits such as NAND and NOR gates are camouflaged so that they appear identical under an optical microscope. However, when all of the device layers on top of the bare semiconductor substrate have been removed by a reverse engineer and an etchant applied to the underlying substrate, the pattern of channel stops may be brought out by selective etching of the substrate. If an etchant is used which etches N and P type material at different rates (typically N-doped material will etch faster than P-doped), a height differential or "step" will be formed at the boundaries between the channel stop and the adjacent oppositely doped interconnection line. If they are large enough, such steps can be detected by either optical microscopes or SEMs, thereby revealing which interconnections have blocking channel stops and which are true conductive interconnections.

SUMMARY OF THE INVENTION

The present invention seeks to provide a camouflaged circuit structure that enjoys the advantages of the channel stops used in the related application, but is not subject to reverse engineering by selective etching of the substrate surface.

The presence or absence of an electrical connection between two spaced conductive implants having a common conductivity in a semiconductor substrate, such as the implanted sources or drains of a pair of adjacent MOSFETs, is camouflaged by establishing steps relative to the substrate surface at the boundaries of the interconnection area. These intentional steps mask the steps that result from a reverse engineering selective etch, preventing a reverse engineer from using either an optical microscope or a SEM to determine whether steps have been produced by the selective etch.

The intentional steps are preferably formed by having an insulating layer, preferably a field oxide formed by a local oxidation of silicon (LOCOS) process, extend into the substrate above and up to the boundaries of the interconnection area. An electrical connection between the two implants is made with a buried layer immediately below the field oxide having the same conductivity as the spaced implants, while the implants can be isolated from each other by means of a buried layer below the field oxide of opposite conductivity to the implants; the latter buried layer together with the field oxide inhibits current flow between the implants. Thus, while some of the transistors will be connected to each other and other transistors will be isolated from each other, a reverse engineer cannot tell whether or not any two adjacent transistors are actually connected.

The invention is applicable to both N-channel and Pchannel devices. In one particular implementation the camouflaged connection/isolation is provided in a central area that extends between the two transistors and is covered with a field oxide, with the areas lateral to the central area provided with isolating implants and no field oxide.

These and other features and advantages of the invention will be apparent to those skilled in the art from the following detailed description, taken together with the accompanying drawings.

DETAILED DESCRIPTION OF THE INVENTION

Related application Ser. No. 08/532,326 camouflages digital logic cells by arranging all of the transistors for each of the cells in a uniform "sea" of transistors in which the boundaries between different cells are not apparent, by arranging the transistors within different cells that have the same number of transistors but different logic functions in the same geometric layout so that the cell functions cannot be determined by the transistor geometries, by using implants that are made electrically conductive by heavy doping and are not readily discernable for intracell connections, and by providing the same geometric layout of intracell interconnections for different logic cells so that the cell functions cannot be determined even if the interconnections are determined by a reverse engineer. A uniform pattern of interconnections is achieved by providing implants for all potential interconnections within each cell, and disabling unwanted interconnections for a given cell with narrow implanted channel stops of opposite conductivity. The channel stops are even more difficult to discern than are the implanted interconnections, yielding a still higher level of protection. Heavily doped implants with a common geometric layout and channel stop interruptions were also used for intercell as well as intracell connections.

The present invention retains all of these features and advantages, and in addition makes it even more difficult to detect the channel stops, and also to detect whether implanted circuit elements are electrically connected or isolated from each other even if a reverse engineer uses a selective etch that removes N and P doped areas at different etch rates.

Figure 1:
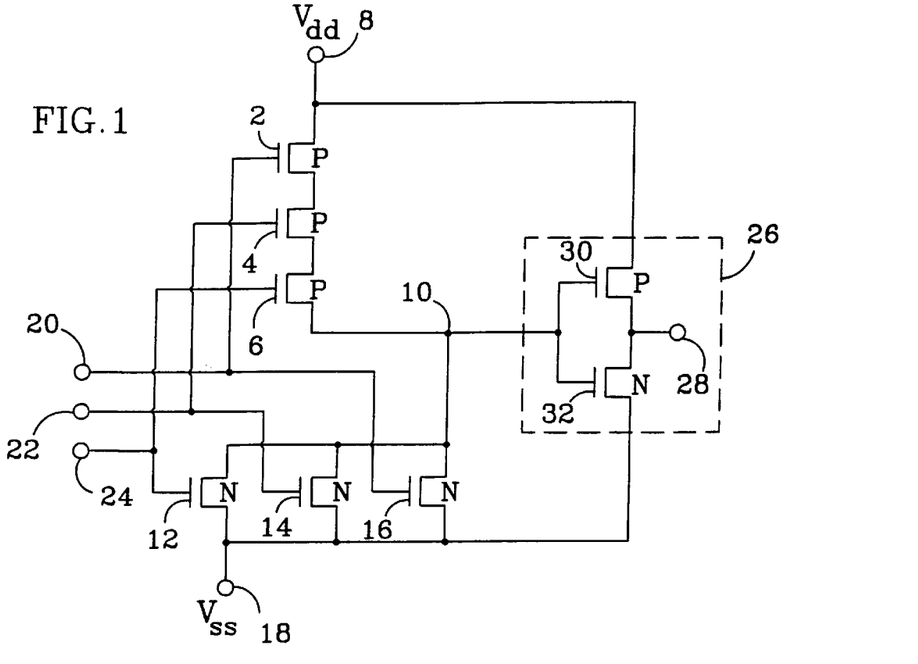
FIG. 1 is a schematic diagram of a logic circuit to which the invention is applicable.

The invention is applicable to many different kinds of digital circuits, such as various types of logic gates. Using common gates such as OR and AND gates as building blocks, many different types of logic circuitry can be designed. FIG. 1 is a schematic diagram of a conventional three-input OR gate circuit, which represents just one of the many circuits to which the invention is applicable. Three P-channel transistors 2, 4 and 6 are connected in series between a positive voltage terminal 8 and an inverted output 10, and three N-channel transistors 12, 14 and 16 are connected in parallel between a negative voltage terminal 18 (which can be designated ground) and the inverted output 10. Input terminals 20, 22 and 24 for three separate inputs are connected to the gates of respective P-channel/N-channel transistor pairs.

The signal at inverted output 10 represents a NOR function. To convert this to an OR output, an inverter 26 inverts the signal at output 10 to produce an OR output at terminal 28. The inverter is conventional, consisting of a P-channel transistor 30 and an N-channel transistor 32 that are connected in series between the positive and negative voltage terminals 8 and 18, with the gates of transistors 30 and 32 receiving an input from inverted output 10, and output terminal 28 tapped from the series junction of transistor 30 and 32.

Figure 2A:
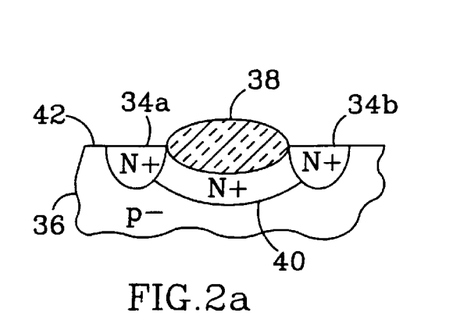
FIG. 2a is a sectional view of an IC substrate showing a camouflaged circuit connection between two doped implant regions in accordance with the invention.
Figure 2B:
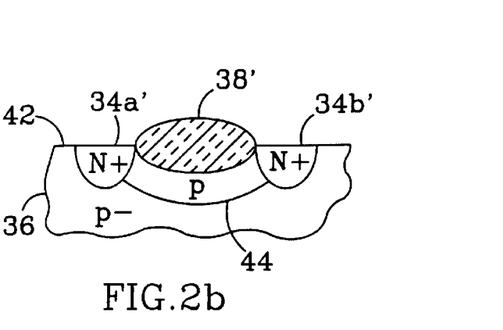
FIG. 2b is a sectional view similar to FIG. 2a, but with aamouflaged electrical isolation between the two implant regions.

FIGS. 2a and 2b illustrate how the presence or absence of an electrical connection between two implanted regions of an IC can be camouflaged by making them appear the same to a reverse engineer, even if a selective etch is used.

Two heavily doped implants 34a and 34b are shown extending in from the surface of a circuit region in a semiconductor substrate 36. The implants 34a, 34b are illustrated as being doped N+, with the substrate's circuit region lightly doped P−. One of the heavily doped conductive implants 34a, 34b could be the source or drain of a MOSFET, while the other implant could be the source or drain of an adjacent MOSFET. However, no limitation to MOSFETs is intended, and in general the implants 34a, 34b could be any conductive regions when it is desired to camouflage whether or not they are electrically connected to each other.

An electrically insulating layer 38 extends into the substrate and between the two implants 34a and 34b. Insulating layer 38 is preferably an oxide of the substrate material, and is typically formed as the field oxide resulting from a conventional local oxidation of silicon (LOCOS) process. Immediately below the insulating layer 38 is a buried layer 40 that is doped N+ and forms a conductive path between the two implants 34a and 34b. The buried layer 40 forms junctures with each of the implants, and extends upward to the juncture of the implants with the insulating layer 38 in the vicinity of the substrate surface 42. It is not necessary that the implants, buried layer 40 and insulating layer 38 meet exactly at the substrate surface; the insulating layer can extend somewhat into the lateral edge of the implants so that the buried layer does not quite reach the substrate surface, although typically the implants will be self-aligned with the insulating layer (as described below).

Although the circuit structure of FIG. 2a has N+ conductive implants set in a P− circuit region of the substrate, the invention is also applicable to a reversal of doping conductivities. In that case two P+ implants would be set in an N− substrate circuit region, and connected to each other with a P+ buried layer.

FIG. 2b illustrates the preferred structure employed by the invention when it is desired to electrically isolate two conductive implants 34a' and 34b' from each other, rather than to connect them as in FIG. 2a. An insulating layer 38', similar to insulating layer 38 of FIG. 2a, extends between the two implants 34a' and 34b'. In this case a buried layer 44 of opposite conductivity to the implants 34a' and 34b' underlies the field oxide 38' and extends between the implants. This is the usual P field implant that underlies the field oxide in the conventional LOCOS process used to isolate N+ implants from each other. The structure of FIG. 2b by itself is not new; the novelty resides in the fact that the structure of FIG. 2b has the same appearance to a reverse engineer as the structure of FIG. 2a, and therefore the reverse engineer will not be able to tell whether the N+ implants are electrically connected or electrically isolated from each other. The manner in which this camouflage works is illustrated in FIGS. 3a and 3b.

Figure 3A:
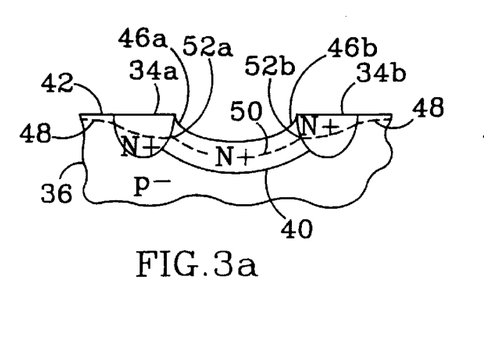
FIGS. 3a and 3b are sectional views respectively showing the circuit structures of FIGS. 2a and 2b with the top layers removed by a reverse engineer.
Figure 3B:
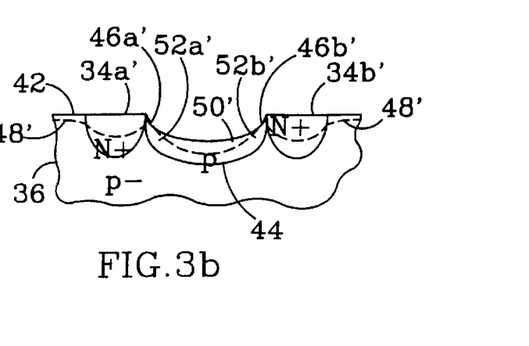

FIG. 3a illustrates the structure of FIG. 2a after a reverse engineer has removed everything above the semiconductor (typically silicon) and exposed the bare semiconductor for selective etching. Selective etching is used in reverse engineering to bring out the boundary of different diffusion or implant types at the silicon surface due to their different etch rates. With the invention, however, the removal of the field oxide 38 leaves "steps" 46a and 46b at either end of the buried connector implant 40, at the upper end of its junctures with the implants 34a and 34b in the vicinity of the substrate surface 42. These "steps" are abrupt downward slopes of the bare silicon surface relative to the substrate surface 42, and are established by the contour of the field oxide layer which has just been removed.

Field oxide grown with a LOCOS process will eat into the surface of the silicon substrate typically by an amount equal to 0.44 times the total oxide thickness. Since the field oxide thickness in a standard submicron CMOS process is about 0.5 micrometer (micron), after removing the field oxide and exposing the bare silicon surface the steps 46a and 46b at the edge of the removed field oxide will be about 0.2 microns deep. However, the junction depth of all implants with submicron CMOS processes is normally about 0.2–0.3 microns (except for the P or N well junction). Any difference in etch rate between the P field implant 44 and the buried conductive layer implant 40 will therefore be less than 0.2–0.3 microns, and will be masked by the existing step of about 0.2 microns established by the field oxide.

The substrate depth after a selective etch which removes N-doped material at a faster rate than P-doped material is illustrated in FIG. 3a by dashed lines, with dashed line 48 representing the surface of the P− substrate circuit region, and dashed line 50 the surface of the N+ implants and buried layer. After the etch has been completed the steps 52a and 52b at the facing edges of the remainder of N+ implants 34a and 34b have a slope and depth that is still influenced mostly by the slope and depth of the original steps 46a and 46b as they existed prior to the etch.

FIG. 3b illustrates the results of selective etching for the electrically isolating P field buried layer 44. The steps 46a' and 46b' at the edges of N+ implants 34a' and 34b' prior to etching are essentially equal in slope and depth to the steps 46a and 46b for the conductive buried layer 40 of FIG. 3a, and the dashed line 48' representing the post-etch surface of the P− circuit region is also essentially the same as dashed line surface 48. However, the post-etch surface of the P field implant (indicated by dashed line 50') is somewhat shallower than the post-etch surface 50 of the N+ conductive buried layer in FIG. 3a. This results in post-etch steps 52a' and 52b' that are not quite as deep as the post-etch steps 52a and 52b. This difference in post-etch step depths is less than what would normally be expected from the selective nature of the etchant, since the upper edges of steps 52a and 52b are established by the relatively large etch depths of the N+ material in implants 34a and 34b, whereas the upper edges of post-etch steps 52a' and 52b' are established by the relatively lesser depth of the P field etch and are thus higher than for steps 52a and 52b. The result is that after selective etching there will not be any obviously different trace, along the boundaries of the area underlying the removed field oxide, between the N+ buried channel implant 40 and the P field implant 44. Any difference will be slight enough that the presence of an N+ buried connector layer instead of the usual P field implant cannot be detected by either an optical microscope or an SEM after selective etching.

FIGS. 4–7 illustrate the application of the invention to MOSFET transistors formed on a semiconductor substrate 54. The substrate is illustrated as having a primary P-doping conductivity, with N-channel MOSFETs T1 and T2 formed directly in the bulk of the substrate, and a pair of P-channel MOSFETs T3 and T4 formed within a circuit region established by an N− well 56 in the substrate. Transistors T1, T2, T3 and T4 have respective sources S1, S2, S3 and S4, drains D1, D2, D3 and D4, and polysilicon gates G1, G2, G3 and G4 overlying transistor channels between their respective sources and drains. Transistors T1 and T2 are adjacent to each other, as are transistors T3 and T4. In conventional, uncamouflaged circuits any connections between T1 and T2 and between T3 and T4 would be made by upper metalization layers, and would thus be readily apparent to a reverse engineer. Each transistor would be entirely surrounded by field oxide, which would isolate the adjacent transistors from each other through the substrate and allow for connections between them only through the metalization.

Figure 4:
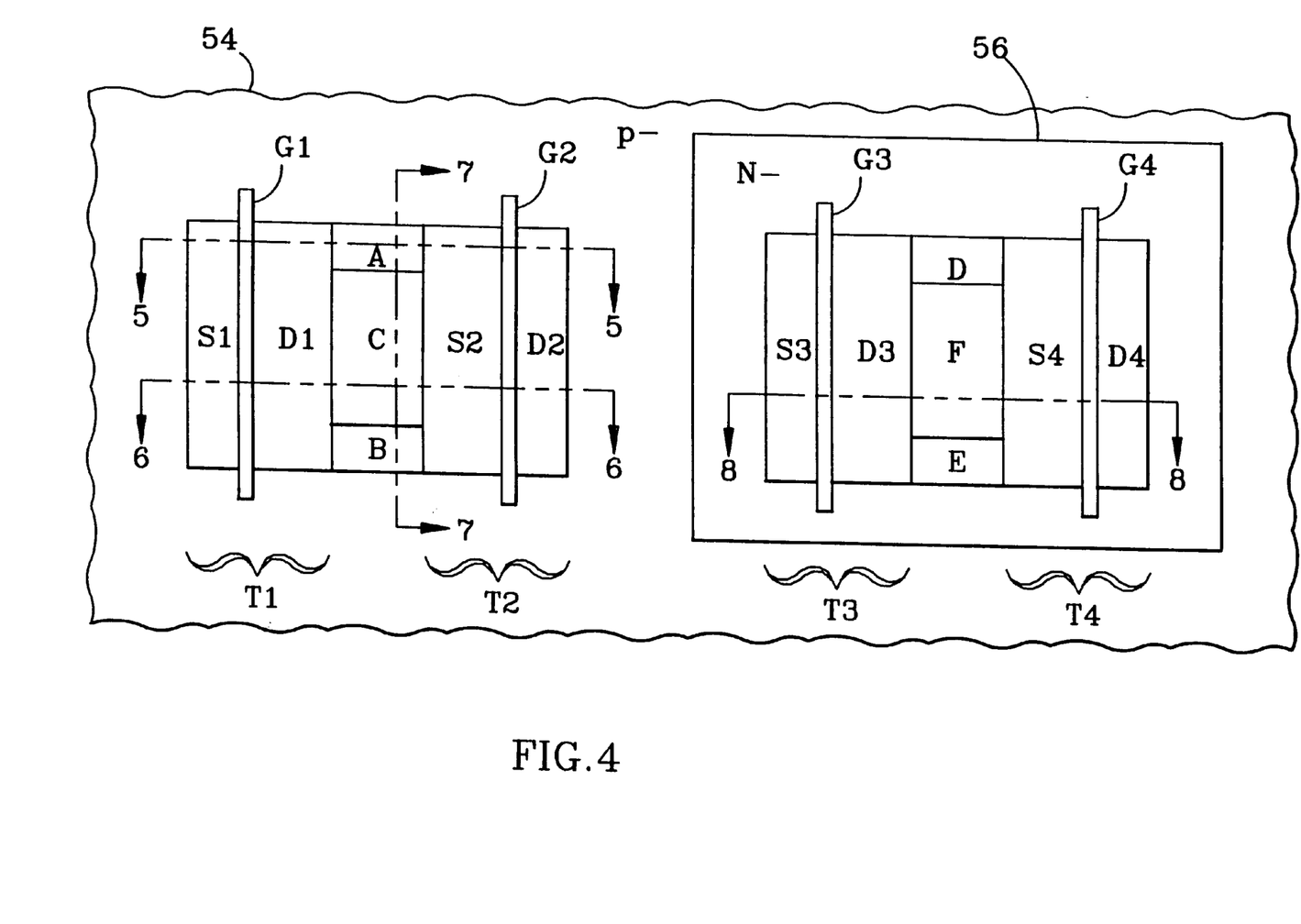
FIG. 4 is a plan view of an IC substrate with two CMOS transistor pairs formed in accordance with the invention.

The transistors T1 and T2 are separated by a central region C, which extends between the central portions of D1 and S2 and is bounded laterally by regions A and B extending between the lateral portions of D1 and S2 on opposite sides of region C. Region C is covered with a field oxide layer, with either a buried conductive N+ layer electrically connecting D1 and S2 below the field oxide, or a buried P field implant isolating D1 from S2 below the field oxide. The substrate surface in regions A and B is bare, with no field oxide. Regions A and B have the same P field implant, whether or not a conductive N+ buried layer is provided in region C. Any electrical connection between D1 and S2 is therefore restricted to region C. The remainder of the surface of substrate 54 surrounding the transistors has the usual field oxide and underlying P field implant.

Since region C has a field oxide layer but all of the regions bounding it (A, B, D1 and S2) are without field oxide layers, steps are formed around the entire boundary of region C. These steps camouflage the nature of the doped layer below the field oxide and prevent a reverse engineer from determining whether it is a conductive N+ buried layer or an insulative P field implant, as described above.

The structure provided for P-channel transistors T3 and T4 is similar to that for T1 and T2, but with reverse conductivities. A central region F between D3 and S4 is covered with field oxide, with a buried P+ layer below the field oxide providing any conductive path between D3 and S4. Region F is laterally bounded by regions D and E, which are without field oxide layers and have N field implants which do not provide any conductive path between D3 and S4.

While in FIG. 4 the drain of one transistor is shown as being connectable to the source of its paired transistor, the transistor layouts could be rearranged to provide camouflaged connections between both sources or both drains. As shown in FIG. 4, the two P-channel transistors T3 and T4 could correspond to transistors 2 and 4 of FIG. 1, with the drain of transistor 2 connected to the source of transistor 4. By rearranging these transistors to have their sources face each other, T3 and T4 could correspond respectively to transistors 2 and 30 of FIG. 1, which have their sources connected together. Similarly, rearranging T1 and T2 so that either their sources or their drains faced each other would allow these transistors to correspond to parallel-connected N-channel transistors 12 and 14 in FIG. 1.

Figure 5:
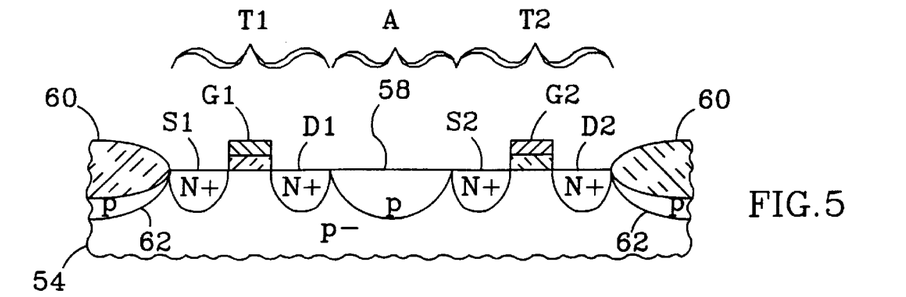
FIG. 5 is a sectional view taken along the section line 5—5 of FIG. 4.

FIG. 5 is a sectional view through region A of FIG. 4; a sectional view through region B would look the same. In region A a P field implant 58 extends between D1 and S2. A common field oxide layer 60 and underlying P field implant 62 surround the outer transistor edges.

Figure 6:
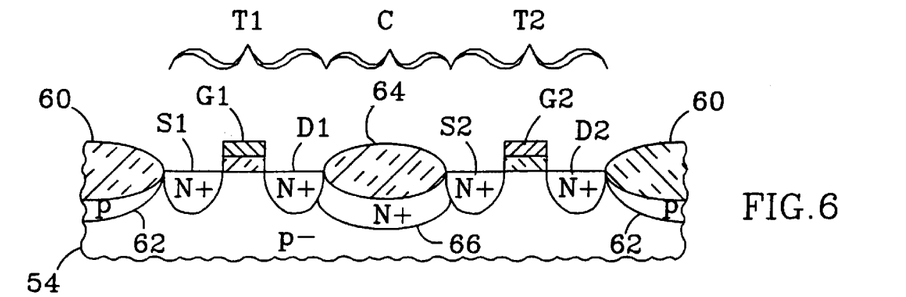
FIG. 6 is a sectional view taken along the section line 6—6 of FIG. 3 for the case of a camouflaged conductive interconnection between the two transistors.

FIG. 6 shows region C between transistors T1 and T2, including a field oxide layer 64 extending between D1 and S2. FIG. 6 illustrates the case of an N+ buried layer 66 underlying the field oxide 64 and providing an electrical connection between D1 and S2, as in FIG. 2a. A P field implant, below field oxide 64, as in FIG. 2b, would together with the field oxide inhibit current flow between D1 and S2.

Figure 7:
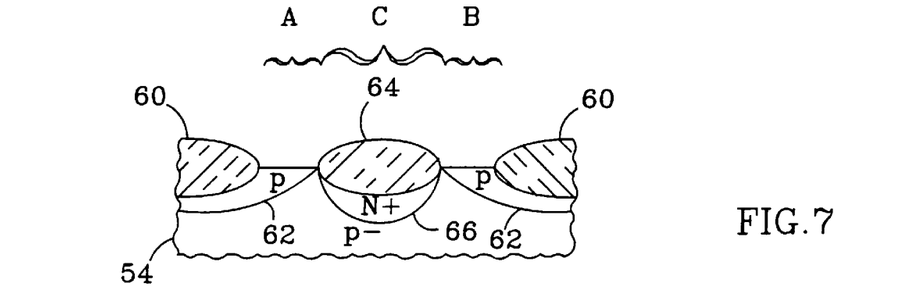
FIG. 7 and 8 are sectional views taken along the section lines 7—7 and 8—8, respectively, of FIG. 4.

FIG. 7 shows a sectional view through region C taken at right angles to the view of FIG. 6. From FIG. 7 it can be seen that the field oxide 64 in region C forms steps with respect to the substrate surface at its boundaries with the P field implant 62, which extends up to the substrate surface in regions A and B since no field oxide is present in these regions. From FIG. 6 it can be seen that the region C field oxide 64 forms steps with respect to the substrate surface at its boundaries with D1 and S2. Thus, region C is completely bounded by steps which camouflage the presence or absence of an N+ buried conductive layer connecting D1 with S2.

Although region C is shown as a single region that is symmetrically positioned with respect to the transistors T1 and T2, other configurations could be employed as long as the regions through which any connections are made between D1 and S2 are bounded by steps in the substrate to inhibit reverse engineering. For example, region C could be divided into multiple areas, each with a field oxide and mutually separated by P field implants without field oxides. Region C could also be extended along the full widths of the transistors if the field oxide is removed from the immediately adjacent portions of the substrate surrounding the transistors.

Figure 8:
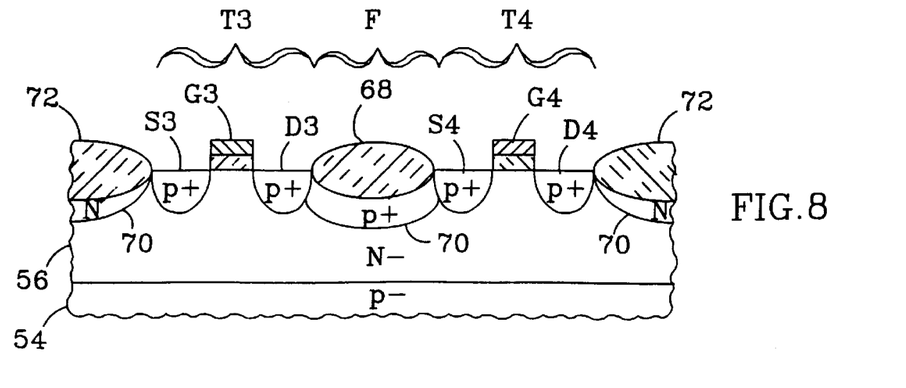

FIG. 8 is a sectional view through region F and transistors T3 and T4, showing the similar structure for the P-channel transistors. A field oxide 68 is formed in region F, with either a buried conductive P+ implant 70 connecting D3 and S4 below the field oxide, or an N field implant (not shown) that cooperates with field oxide 68 to inhibit current flow between D3 and S4. An N field implant 70 is provided below the field oxide layer 72 in the N-well 56 surrounding T3 and T4.

The preferred sequence to fabricate the IC structure described above is to first form a mask on the substrate surface, typically consisting of a layer of $Si_3N_4$ over a layer of $SiO_2$, to expose the field implant areas. The field implants which underlie the later conventional field oxide layer and also establish the regions A, B, D and E of FIG. 4 are then performed; boron is typically used for a P field implant for regions A and B, and arsenic or phosphorous for an N field implant for regions D and E. The implants are preferably performed with a flood beam, although older diffusion techniques or a focused ion beam could also be used. The field implants are typically made to a depth of about 0.2 to 0.6 microns, with a dopant concentration on the order of $10^{18}$ atoms/cm$^3$ or higher.

After the field implants have been completed, a new mask is laid down to expose the areas intended for the buried conductive layers, such as layer 66 in FIG. 6 or 70 in FIG. 8. The conductive layers are then implanted, typically to a depth of about 0.5 to 2.0 microns and a doping concentration on the order of $10^{19}$ atoms/cm$^3$ or higher. The regions C and F of FIG. 4 would be implanted at this time if conductive interconnects between their respective transistors are desired; blocking field implants would have been provided in the previous implant step if interconnections were not desired. For both the blocking field implants and the conductive buried layer implants, separate masks would be provided and separate implants performed for the N-channel and P-channel devices.

The field oxide layers are next grown using a standard LOCOS process, followed by the formation of thin gate oxide layers (typically about 100–150 Angstroms thick for a 0.5 micron channel length) over the transistor areas exposed by the field oxide, and then the deposit of polysilicon over the entire substrate surface and an etch removal of the polysilicon except from the desired gate areas. Finally, source and drain implants are performed using the field oxide and gates as masks so that they are self-aligned with the source and drain implants. A separate mask would be provided over areas A, B, D and E of FIG. 4 to prevent the dopant from penetrating the substrate in these areas.

To reduce any disruption of the standard CMOS fabrication process, the insulative field implants and conductive buried layer implants associated with the new camouflage technique are preferably performed after the well drive-in and before the growth of field oxide to prevent the high-temperatures associated with the well drive-in from affecting the concentration profile of the dopant implants.

The insulative field implant has a doping concentration that is higher than the doping concentration of the bulk of the substrate or the well in which it is set, but less than the source and drain doping concentration. With the substrate bulk and well having a doping concentration on the order of $10^{15}$ to $10^{16}$ atoms/cm$^3$ and the source/drain implants having a doping concentration on the order of $10^{19}$ to $10^{20}$ atoms/cm$^3$, a typical field implant concentration of about $10^{18}$ atoms/cm$^3$ produces an overall resistivity that is roughly five times greater than the resistivity of the source/drain implants (the resistivity will actually vary over the volume of the implants, since the doping concentrations are typically lighter towards the bottoms of the implants than towards their tops). This concentration differential prevents an excessive reduction in the breakdown voltage between the two adjacent transistors, and allows the field implants to perform an insulating function between adjacent transistors.

Figure 9:
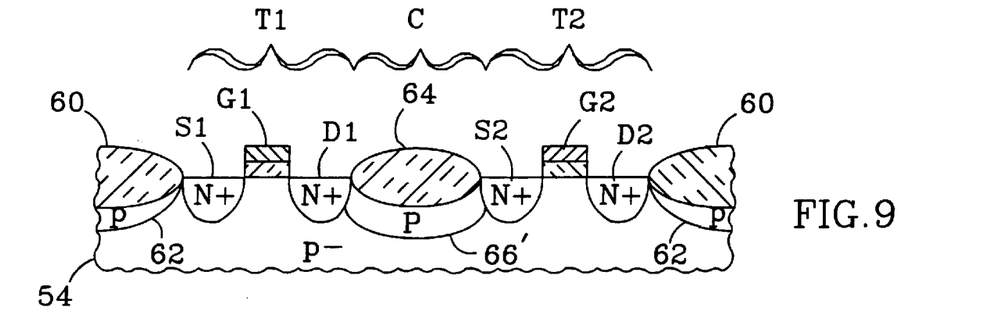
FIGS. 9, 10 and 11 are sectional views similar to FIGS. 6, 7 and 8, respectively, but with isolating buried layers between two transistors.

FIG. 9 is a sectional view similar to FIG. 6, but with the buried layer 66 between the drain D1 of transistor T1 and the source S2 of transistor T2 doped P and indicated by reference number 66'; all other elements of FIG. 9 are the same as in FIG. 6. This implements a camouflaged electrical isolation between the two transistors of the type illustrated in FIG. 2b. As in FIG. 2b, the insulating buried layer 66' is doped P at a doping concentration greater than the P-doping concentration of the substrate 54. Insulating buried layer 66' is disposed within the substrate immediately below the electrically insulating field oxide layer 64 and extends between the regions D1 and S2 of transistors T1 and T2 between which the electrically insulating layer 64 extends. As in FIG. 6, insulating layer 64 forms respective steps, relative to the substrate surface, between the buried layer 66' and the transistor regions between which it extends. The insulating layer 64 together with the buried layer 66' inhibits current flow between the transistor regions D1 and S2.

Figure 10:
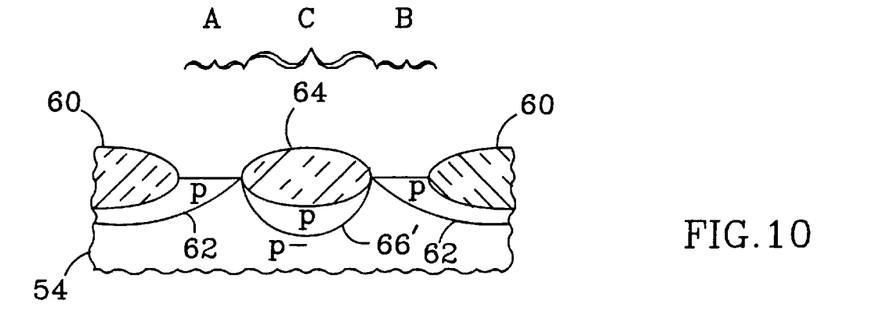

FIG. 10 is a sectional view similar to FIG. 7, but conforming to FIG. 9 by showing the P doped buried layer 66' below the field oxide insulating layer 64.

Figure 11:
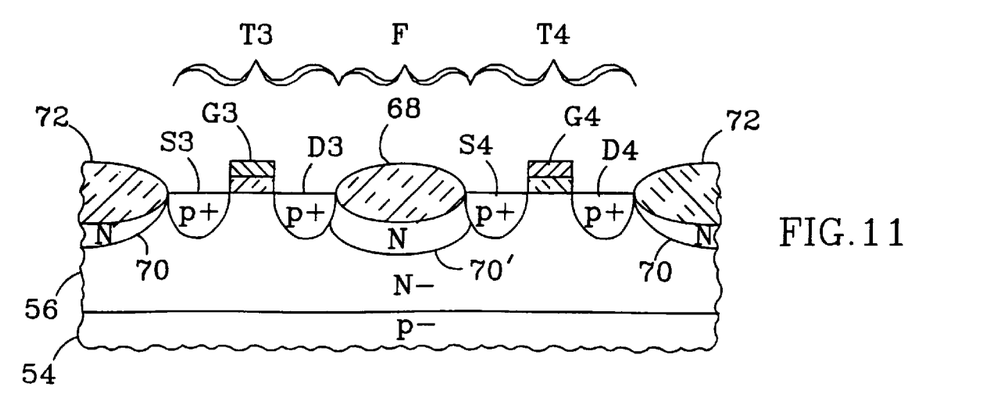

FIG. 11 is a sectional view similar to FIG. 8, but with the buried layer 70 between the drain D3 of transistor T3 and the source S4 of transistor T4 doped N and indicated by reference number 70'; all other elements of FIG. 11 are the same as in FIG. 8. The transistors T3 and T4 are still set within the N– well 56, whose doping conductivity is opposite to the P– primary conductivity of the substrate 54. As in the camouflaged electrical isolation of FIG. 2b, the doping concentration of buried layer 70' is greater than that of the circuit region established by the well 56.

The buried layer 70' is disposed within the substrate immediately below the electrically insulating field oxide layer 68 and extends between the same transistor regions D3 and S4 as the insulating layer 68. The insulating layer 68 forms respective steps, relative to the substrate surface, between the buried layer 70' and the transistor regions between which it extends and, together with the buried layer 70', inhibits current flow between the transistor regions D3 and S4.

Figure 12:
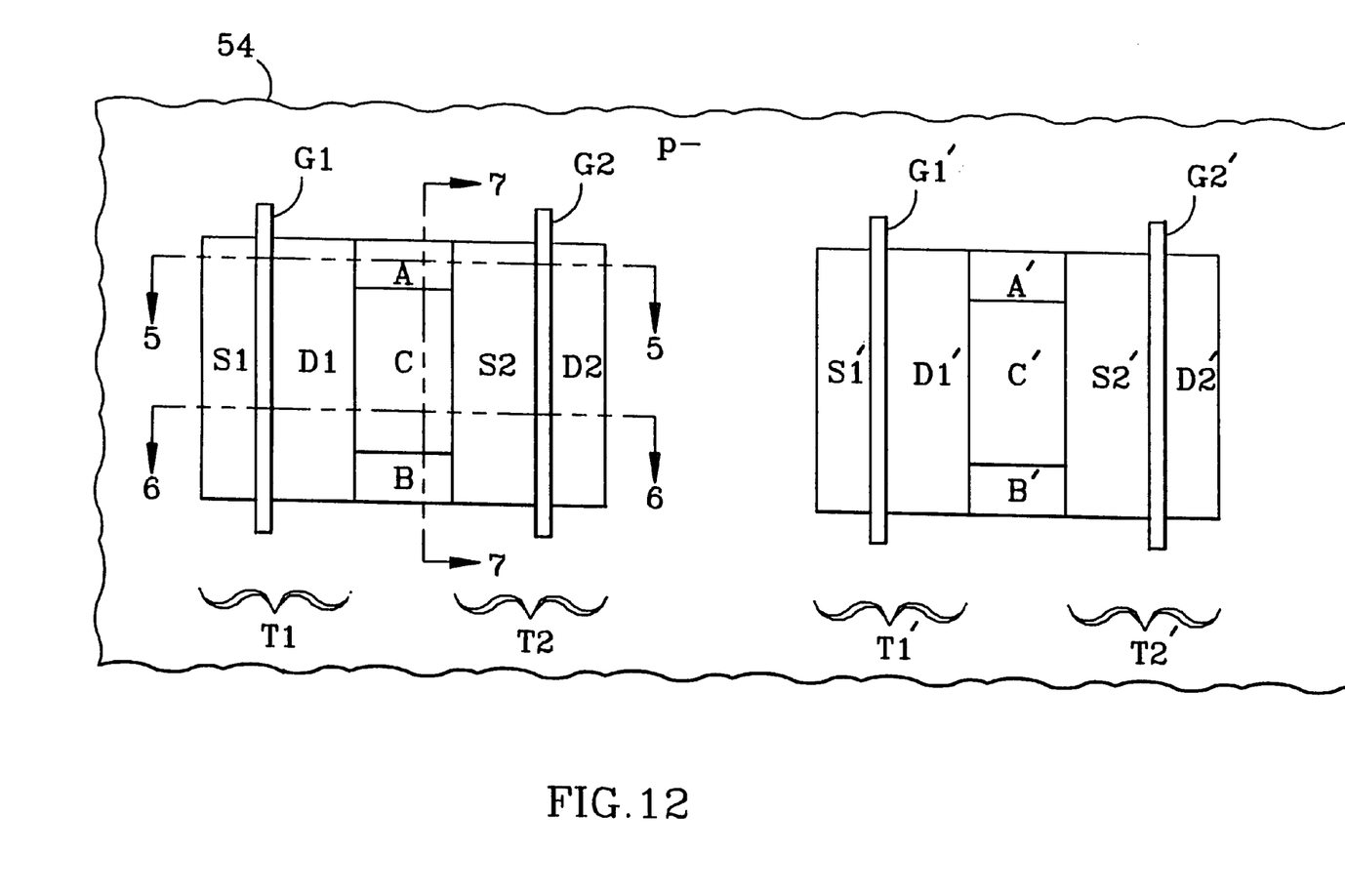
FIG. 12 is a plan view similar to FIG. 4, but with all of the transistors implanted into the substrate without a well and one pair of transistors electrically isolated from each other.

In another embodiment shown in FIG. 12, the two right-hand transistors T3 and T4 of FIG. 4 are replaced by a pair of transistors T1' and T2' that can be identical to transistors T1 and T2 of FIG. 4, except for the conductivity of the buried layer between T1' and T2'. In FIG. 12 the corresponding elements of T1', T2' and T1, T2 are indicated by the same reference numbers as in FIG. 4, with a switch from "3" and "4" to "1", and "2" and the addition of a prime to the elements of T1' and T2'. A sectional view of T1' and T2' would correspond to FIG. 9, with the buried layer 66' doped to the conductivity of the substrate 54 but at a concentration greater than the substrate doping concentration to electrically isolate from each other the transistor regions D1' and S2' which bound the electrically insulating field oxide layer 64.

Figure 13:
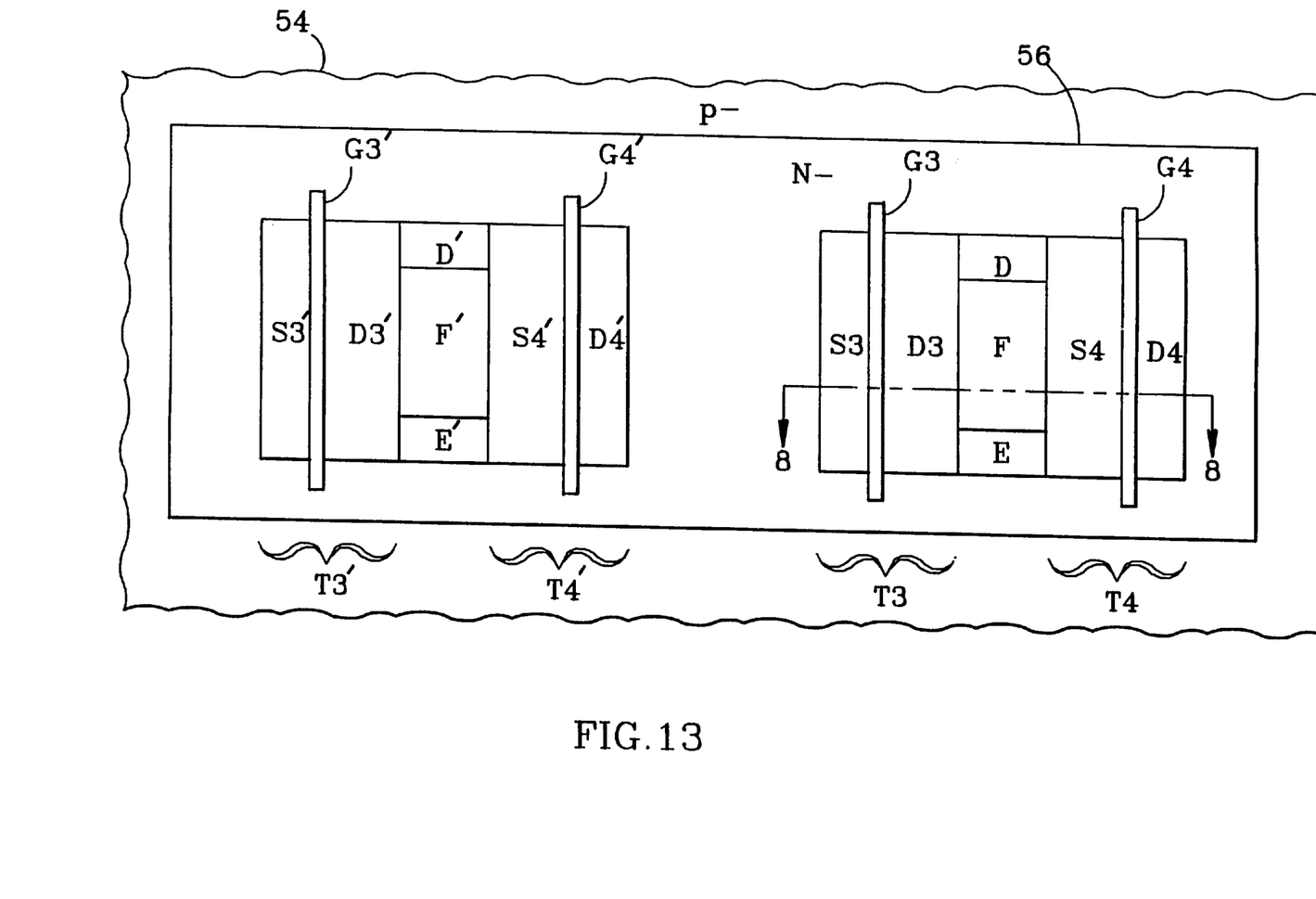
FIG. 13 is a plan view similiar to FIG. 4, but with all of the transistors implanted into a well within the substrate and the transistors of one pair electrically isolated from each other.

Another embodiment illustrated in FIG. 13 has both transistor pairs within the well 56 of FIG. 4. Transistors T3 and T4 are the same as in FIGS. 4 and 8, while transistors T1 and T2 have been replaced by transistors T3' and T4' which can be identical to transistors T3 and T4, except for the buried layer which extends between them being doped N to inhibit current flow between the two transistors. The elements of transistors T3', T4' which correspond to the elements of T3, T4 are identified by the same reference numbers with the addition of a prime. Thus, transistors T3' and T4' would have the structure illustrated in FIG. 11 with the buried layer 70' doped N, the same doping conductivity as the well 56, to electrically isolate the transistor regions D3' and S4' which bound the insulating field oxide layer 68 from each other.

While several illustrative embodiments of the invention have been shown and described, numerous variations and alternate embodiments will occur to those skilled in the art. Such variations and alternate embodiments are contemplated, and can be made without departing the from spirit and scope of the invention as defined in the appended claims.

We claim:

1. A camouflaged circuit structure, comprising:
   a semiconductor substrate,
   a first pair of spaced conductive implants having a common conductivity and extending into said substrate,
   a first electrically insulating layer extending into said substrate between said conductive implants,
   a conductive first buried layer of the same conductivity as said spaced conductive implants disposed within said substrate immediately below said electrically insulating layer and electrically connecting said spaced conductive implants,
   a second pair of spaced conductive implants with the same conductivity as said first pair and extending into said substrate,
   a second electrically insulating layer extending into said substrate between said second pair of conductive implants, and
   a second buried layer, doped opposite to the conductivity of said second pair of implants, disposed within said substrate immediately below said second electrically insulating layer and extending between said second pair of implants, said second insulating layer together with said second buried layer inhibiting current flow between said second pair of implants.

2. The circuit structure of claim 1, said substrate having a surface into which said implants and electrically insulating layer extend, said electrically insulating layer forming respective steps, relative to said surface, in the vicinity of said conductive implants.

3. The circuit structure of claim 2, said electrically insulating layer comprising an oxide of the substrate material.

4. The circuit structure of claim 1, one of said conductive implants comprising a source or drain of a metal-oxide-semiconductor field effect transistor (MOSFET), and the other of said conductive implants comprising a source or drain of another MOSFET.

5. The circuit structure of claim 1, wherein said substrate is doped to a primary substrate conductivity, and said implants are doped opposite to said primary substrate conductivity.

6. A camouflaged circuit structure, comprising:
   a semiconductor substrate doped to primary substrate conductivity,
   a first pair of spaced conductive implants having a common conductivity and extending into said substrate, said implants doped to the same conductivity as said primary substrate conductivity and set in a substrate well doped opposite to said primary substrate conductivity, a first electrically insulating layer extending into said substrate between said conductive implants, a conductive first buried layer of the same conductivity as said spaced conductive implants disposed within said substrate immediately below said electrically insulating layer and electrically connecting said spaced conductive implants, a second pair of spaced conductive implants with the same conductivity as said first pair and extending into said substrate, a second electrically insulating layer extending into said substrate between said second pair of conductive implants, and a second buried layer, doped opposite to the conductivity of said second pair of implants, disposed within said substrate immediately below said second electrically insulating layer and extending between said second pair of implants, said second insulating layer together with said second buried layer inhibiting current flow between said second pair of implants.

7. A camouflaged circuit structure, comprising:

a semiconductor substrate, a first pair of spaced conductive implants having a common conductivity and extending into said substrate, a first electrically insulating layer extending into said substrate between said conductive implants, a conductive first buried layer of the same conductivity as said spaced conductive implants disposed within said substrate immediately below said electrically insulating layer and electrically connecting said spaced conductive implants, a second pair of spaced conductive implants of opposite conductivity to said first pair and extending into said substrate, a second insulating layer extending into said substrate between said second pair of implants, and a second doped buried layer disposed within said substrate immediately below said second electrically insulating layer and extending between said second pair of implants, said substrate being doped to a primary substrate conductivity, and one of said pairs of implants and their associated insulating layer and buried layer being set in a doped substrate well of opposite conductivity to said primary substrate conductivity.

8. A camouflaged transistor structure, comprising:

a semiconductor substrate with a surface, a first pair of transistors having respective source and drain regions with a common conductivity extending into said substrate from said surface, and respective gates overlying respective channels between said source and drain regions, a first electrically insulating layer extending into said substrate between a source or drain region of one transistor and a source or drain region of the other transistor a first doped buried layer of the same conductivity as said source and drain regions disposed within said substrate immediately below said first electrically insulating layer and electrically connecting the regions of said transistors between which said first electrically insulating layer extends, said first electrically insulating layer forming respective steps, relative to said substrate surface, between said buried conductive layer and the transistor regions which it connects, a second pair of transistors spaced from said first pair, said second pair of transistors having respective source and drain regions with a common conductivity opposite to that of the first transistor pair source and drain regions and extending into said substrate from said surface, and respective gates overlying respective channels between said source and drain regions, a second electrically insulating layer extending into said substrate between a source or drain region of one transistor of said second pair and a source or drain region of the other transistor of said second pair, and a second doped buried layer disposed within said substrate immediately below said second electrically insulating layer and extending between the regions of said second transistor from between which said second electrically insulating layer extends, said second electrically insulating layer forming respective steps, relative to said substrate surface, between said second pair buried layer and the transistor regions between which it extends, said substrate being doped to a primary substrate conductivity, and one of said transistor pairs and its associated insulating layer and buried layer being set in a substrate well of opposite conductivity to said primary substrate conductivity.

9. The transistor structure of claim 8, said electrically insulating layer comprising an oxide of said substrate material.

10. A camouflaged transistor structure, comprising:

a semiconductor substrate having a surface and a circuit region that is doped to a circuit region conductivity at a circuit region doping concentration, a pair of transistors having respective source and drain regions with a common conductivity opposite to said circuit region conductivity extending into said substrate from said surface, and respective gates overlying respective channels between said source and drain regions, an electrically insulating layer extending into said substrate between a source or drain region of one transistor and a source or drain region of the other transistor, and a buried layer, doped to said circuit region conductivity but at a concentration greater than said circuit region doping concentration, disposed within said substrate immediately below said electrically insulating layer and extending between the regions of said transistors between which said electrically insulating layer extends, said electrically insulating layer forming respective steps, relative to said substrate surface, between said buried layer and the transistor regions between which it extends, said electrically insulating layer together with said buried layer inhibiting current flow between the transistor regions between which said buried layer extends.

11. The transistor structure of claim 10, said electrically insulating layer comprising an oxide of the substrate material.

12. The transistor structure of claim 10, wherein the portion of said substrate which is external to said circuit region, transistors, electrically insulating layer and buried layer is doped to a conductivity and doping concentration substantially equal to said circuit region conductivity and doping concentration.

13. The transistor structure of claim 10, wherein said substrate is doped to a primary substrate conductivity, and said circuit region comprises a well within said substrate have a doping conductivity opposite to said primary substrate conductivity.

14. A camouflaged transistor structure, comprising:
a semiconductor substrate having a surface and a circuit region that is doped to a circuit region conductivity at a circuit region doping concentration,
a pair of transistors having respective source and drain regions with a common doping conductivity opposite to said circuit region conductivity and extending into said circuit region from said surface, and respective gates overlying respective channels between said source and drain regions,
mutually spaced lateral isolation implants of opposite doping conductivity to said source and drain regions extending into said circuit region from said surface between the source or drain region of one transistor and the source or drain region of the other transistor, and
an electrically insulating layer extending into said substrate and bounded by said lateral isolation regions and the transistor regions between which said lateral isolation implants extend, said electrically insulating layer forming respective steps, relative to said substrate surface, at its boundaries with said lateral isolation regions and said transistor regions.

15. The transistor structure of claim 14, further comprising a highly doped buried layer of the same conductivity as said source and drain regions disposed within said substrate immediately below said insulating layer and electrically connecting the transistor regions which bound said electrically insulating layer.

16. The transistor structure of claim 14, further comprising a buried layer, doped to said circuit region conductivity but at a concentration greater than said circuit region doping concentration, disposed within said substrate immediately below said insulating layer and, together with said insulating layer, electrically isolating the transistor regions which bound said insulating layer from each other.

17. The transistor structure of claim 14, said electrically insulating layer comprising an oxide of the substrate material.

18. The transistor structure of claim 14, wherein the portion of said substrate which is external to said circuit region, transistors, isolation implants and electrically insulating layer is doped to a conductivity and doping concentration substantially equal to said circuit region conductivity and doping concentration.

19. The transistor structure of claim 14, wherein said substrate is doped to a primary substrate conductivity, and said circuit region comprises a well within said substrate have a doping conductivity opposite to said primary substrate conductivity.

20. A camouflaged transistor circuit structure, comprising:
a semiconductor substrate having a surface and a circuit region that is doped to a circuit region conductivity at a circuit region doping concentration,
a plurality of transistor pairs in said circuit region, each transistor pair comprising:
respective source and drain regions with a common conductivity opposite to said circuit region conductivity and extending into said substrate from said surface, and respective gates overlying respective channels between said source and drain regions,
mutually spaced lateral isolation regions extending into said circuit region from said surface between the source or drain region of one transistor and the source or drain region of the other transistor, and
an electrically insulating layer extending into said substrate and bounded by said lateral isolation regions and the transistor regions between which said lateral isolation implants extend, said electrically insulating layer forming respective steps, relative to said substrate surface, at its boundaries with said lateral isolation regions and transistor regions,
at least one of said transistor pairs including a buried conductive layer of the same conductivity as the source and drain regions for said pair disposed immediately below the electrically insulating layer for said pair and electrically connecting the transistor regions which bound said electrically insulating layer, and at least one other of said transistor pairs including a buried layer, doped to said circuit region conductivity but at a concentration greater than said circuit region doping concentration, disposed within said substrate immediately below the electrically insulating layer for said pair and, together with said electrically insulating layer, electrically isolating the transistor regions which bound said electrically insulating layer from each other.

21. The transistor circuit structure of claim 20, the electrically insulating layer for each transistor pair comprising an oxide of the substrate material.

22. The transistor circuit structure of claim 20, wherein the remainder of said substrate is doped to a conductivity and doping concentration substantially equal to said circuit region conductivity and doping concentration.

23. The transistor circuit structure of claim 20, wherein said substrate is doped to a primary substrate conductivity, and said circuit region comprises a well within said substrate have a doping conductivity opposite to said primary substrate conductivity.

24. A camouflaged circuit structure, comprising:
a semiconductor substrate having a surface,
a first pair of spaced conductive implants having a common conductivity and extending into said substrate from its surface,
a conductive first doped layer of the same conductivity as said implants extending between, electrically connecting and forming junctures with said implants, said first doped layer forming respective steps, relative to said surface, at its junctures with said implants,
second pair of spaced conductive implants with the same, conductivity as said first pair and extending into said substrate from its surface, and
a second doped layer doped opposite to the conductivity of said second pair of implants extending between, forming junctures with and inhibiting current flow between said second pair of implants, said second doped layer forming respective steps, relative to said substrate surface, at its junctures with said second pair of implants.

25. The circuit structure of claim 24, one of said conductive implants comprising a source or drain of a metal-oxide-semiconductor field effect transistor (MOSFET), and the other of said conductive implants comprising a source or drain of another MOSFET.

26. The circuit structure of claim 24, wherein said substrate is doped to a primary substrate conductivity, and said implants are doped opposite to said primary substrate conductivity.

27. A camouflaged circuit structure comprising:
a semiconductor substrate having a surface, said substrate doped to a primary substrate conductivity,
a first pair of spaced conductive implants having a common conductivity and extending into said substrate from its surface, said implants doped to the same conductivity as said primary substrate conductivity and set in a substrate well doped opposite to said primary substrate conductivity, and a conductive first doped layer of the same conductivity as said implants extending between, electrically connecting and forming junctures with said implants, said first doped layer forming respective steps, relative to said surface, at its junctures with said implants, a second pair of spaced conductive implants with the same conductivity as said first pair and extending into said substrate from its surface, and a second doped layer doped opposite to the conductivity of said second pair of implants extending between, forming junctures with and inhibiting current flow between said second pair of implants, said second doped layer forming respective steps, relative to said substrate surface, at its junctures with said second pair of implants.

28. A camouflaged circuit structure comprising:

a semiconductor substrate having a surface, a first pair of spaced conductive implants having a common conductivity and extending into said substrate from its surface, a conductive first doped layer of the same conductivity as said implants extending between, electrically connecting and forming junctures with said implants, said first doped layer forming respective steps, relative to said surface, at its junctures with said implants, a second pair of spaced conductive implants of opposite conductivity to said first pair and extending into said substrate from its surface, and a second doped layer forming junctures with and inhibiting current flow between said second pair of implants, said second doped layer forming respective steps, relatiuve to said substrate surface, at its junctures with said second pair of implants, said substrate being doped to a primary substrate conductivity, and one of said pairs of implants and their associated doped layer being set in a doped substrate well of opposite conductivity to said primary substrate conductivity.

29. A camouflaged transistor structure, comprising:

a semiconductor substrate with a surface, a first pair of transistors having respective source and drain regions with a common conductivity extending into said substrate from said surface, and respective gates overlying respective channels between said source and drain regions, a first doped buried layer of the same conductivity as said source and drain regions disposed within said substrate and electrically connecting a source or drain region of one transistor with a source or drain region of the other transistor, a first electrically insulative layer extending into said substrate and bounding said first buried layer to form steps, relative to said substrate surface, at the boundaries of said-first layer, a second pair of transistors having respective source and drain regions with a common conductivity extending into said substrate from said surface and respective gates overlying respective channel regions between said source and drain regions, a second doped buried layer of opposite conductivity to said second transistor pair source and drain regions disposed within said substrate, extending between a source or drain region of one transistor of said second pair and a source or drain region of the other transistor of said second pair and electrically isolating from each other the source or drain regions between which it extends, and a second electrically insulating layer extending into said substrate and bounding said second buried layer to form steps, relative to said substrate surface, at the boundaries of said second buried layer.

30. A camouflaged circuit structure, comprising:

a semiconductor substrate having a surface, a first pair of spaced conductive implants having a common conductivity and extending into said substrate, a first doped buried layer of the same conductivity as said first pair of implants disposed within said substrate and electrically connecting said implants, a first electrically insulative layer extending into said substrate and bounding said first buried layer to form steps, relative to said substrate surface, at the boundaries of said first buried layer, a second pair of spaced conductive implants having a common conductivity and extending into said substrate, a second doped buried layer of opposite conductivity to said second pair of implants disposed within said substrate, extending between said second pair of implants and electrically isolating the implants of said second pair from each other, and a second electrically insulating layer extending into said substrate and bounding said second buried layer to form steps, relative to said substrate surface, at the boundaries of said second buried layer.

31. A method of fabricating camouflaged interconnections between at least two pairs of conductive implants in a semiconductor substrate, in which the implants of each respective pair have a common conductivity, comprising:

for each pair of implants, forming a respective electrically insulating layer which extends into said substrate between its respective implants, for each of at least some of said implant pairs, forming a respective conductive buried layer of the same conductivity as its respective implant pair within said substrate immediately below its respective electrically insulating layer and electrically connecting its respective implants, and for each of at least some other of said implant pairs, forming a respective buried layer, doped opposite to the conductivity of its respective implants, within said substrate immediately below its respective electrically insulating layer and extending between its respective implants to inhibit, together with its respective electrically insulating layer, current flow between its respective implants.

32. The method of claim 31, wherein each of said electrically insulating layers form respective steps, relative to the substrate surface, between their respective buried layers and their respective implants.

* * * * *